United States Patent [19]
Kawasaki

[11] Patent Number: 5,276,397
[45] Date of Patent: Jan. 4, 1994

[54] GRADIENT MAGNETIC FIELD IRRADIATION METHOD IN NUCLEAR MAGNETIC RESONANCE IMAGING (MRI) AND MRI APPARATUS USING SAID METHOD

[75] Inventor: Shinji Kawasaki, Matsudo, Japan

[73] Assignee: Hitachi Medical Corporation, Tokyo, Japan

[21] Appl. No.: 911,484

[22] Filed: Jul. 10, 1992

[30] Foreign Application Priority Data

Sep. 13, 1991 [JP] Japan .................. 3-261238

[51] Int. Cl.$^5$ ............................................. G01R 33/20
[52] U.S. Cl. ...................................... 324/309; 324/300
[58] Field of Search ............... 324/309, 307, 300, 310, 324/314, 313

[56] References Cited

U.S. PATENT DOCUMENTS

5,109,197  4/1992  Onodera et al. ................. 324/309
5,109,854  5/1992  Provost .............................. 324/309

Primary Examiner—Michael J. Tokar
Assistant Examiner—Raymond Y. Mah
Attorney, Agent, or Firm—Antonelli, Terry, Stout & Kraus

[57] ABSTRACT

A gradient magnetic field irradiation method comprising irradiating RF pulses and a slice plane selection gradient magnetic field to excite an atomic nucleus of a slice plane, irradiating then first, second and third frequency encoding gradient magnetic fields under the following condition and receiving NMR signals during the irradiation of the third frequency encoding gradient magnetic field:

(A) $(1/k) - (4/n) + 1 = 0$ where a ratio of intensity of the first, second and third frequency encoding gradient magnetic field is $k:n:1$;

(B) the irradiation time of the first and second frequency encoding gradient magnetic fields is $T/k$ and $2T/n$, respectively, when the irradiation time of the third frequency gradient magnetic field is $2T$; and (C) a time interval between the start timing of the irradiation of the first frequency encoding gradient magnetic field and the start timing of the irradiation of the second frequency encoding gradient magnetic field is equal to a time interval between the start timing of the irradiation of the second frequency encoding gradient magnetic field and the start timing of the irradiation of the third frequency gradient magnetic field.

8 Claims, 5 Drawing Sheets

GRADIENT MAGNETIC FIELD IRRADIATION METHOD IN NUCLEAR MAGNETIC RESONANCE IMAGING (MRI) AND MRI APPARATUS USING SAID METHOD

BACKGROUND OF THE INVENTION

In a nuclear magnetic resonance imaging (hereinafter referred to as "MRI") apparatus for obtaining a tomogram of a desired portion of a subject (human body) by utilizing a nuclear magnetic resonance (hereinafter referred to "NMR") phenomenon, this invention relates to a method of irradiating a gradient magnetic field employing gradient moment nulling effect for rephasing those phases which are dephased by the movement of nuclei spinning (hereinafter defined as "nuclear spins") in a pulse sequence of the irradiation of a gradient magnetic field for imaging at a predetermined rate, and for reducing artifacts resulting from the movement and flow, and to an MRI apparatus using this method. More in particular, the present invention relates to a gradient magnetic field irradiation method and a controller therefore capable of preventing free induction decay signals (FID signals) occurring due to incompleteness of 180° excitation radio frequency (RF) pulses particularly when applied to a spin echo method, from being rephased and superposed with original echo signals during signal sampling and thus resulting in artifacts.

The MRI apparatus measures a density distribution, a relaxation time distribution, etc. of atomic nuclei at a desired inspection portion of a subject by utilizing the NMR phenomenon, and obtains and displays an image of an arbitrary section or slice of the subject from the measurement data.

FIGS. 1 and 2 of the accompanying drawings illustrate the timing of the irradiation of frequency encoding direction gradient magnetic fields when a gradient moment nulling method is applied in a frequency encoding direction so as to rephase the phases of the dephased spins moving at a predetermined rate in a pulse sequence of a spin echo method as one of the measuring sequences used in the MRI apparatus described above.

In the pulse sequence shown in FIG. 1, after a 90° excitation RF pulse (hereinafter referred to as the "90° pulse") is irradiated as shown in FIG. 1(a), a negative gradient magnetic field pulse 21 is irradiated as shown in FIG. 1(b) and immediately thereafter, a gradient magnetic field pulse 22 having a positive intensity and area (expressed by intensity x irradiation time) equal to those of the gradient magnetic field pulse 21 are irradiated. Next, a 180° excitation RF pulse (hereinafter referred to as the "180° pulse") is irradiated as shown in FIG. 1(a) and then a negative gradient magnetic field pulse 23 is irradiated as shown in FIG. 1(b). At this time, the intensity and area of this gradient magnetic field pulse 23 are equal to those of the gradient magnetic field pulse 21 described above. Immediately thereafter, a positive gradient magnetic field 24 which is to serve as a signal readout gradient magnetic field pulse is irradiated. The intensity of this gradient magnetic field pulse 24 is equal to that of the gradient magnetic field pulse 21 and its area is twice that of the gradient magnetic field pulse 21. The interval Ti₁ from the irradiation timing of the 90° pulse to the irradiation timing of the 180° pulse is equal to the interval Ti₂ from the irradiation timing of the 180° pulse to the center of the positive gradient magnetic field pulse 24.

In the pulse sequence shown in FIG. 2, after the 90° pulse and the 180° pulse are irradiated as shown in FIG. 2(a), a positive gradient magnetic field pulse 25 is irradiated as shown in FIG. 2(b) and immediately thereafter, a negative gradient magnetic field pulse 26 is irradiated and furthermore, a positive gradient magnetic field pulse 27 to serve as a signal readout gradient magnetic field pulse is irradiated immediately after the irradiation of the pulse 26. At this time, the intensity of each of these gradient magnetic field pulses 26 and 27 is equal to that of the first gradient magnetic 25. The interval Ti₁ from the irradiation timing of the 90° pulse to the irradiation timing of the 180° pulse is equal to the interval Ti₃ from the irradiation timing of the 180° pulse to the center of the positive gradient magnetic field pulse 27.

In this case, in order to keep the rephasing effect unaltered with the change of the echo time, it has been customary to irradiate the frequency encoding direction gradient magnetic field Gf shown in FIG. 1(b) or FIG. 2(b) to the irradiation of the 90° pulse and the 180° pulse shown in FIGS. 1(a) and 2(a), and to insert one-half of the extension of the echo time into the position ① immediately before the negative gradient magnetic field pulse 21 or into the position ②, immediately after the positive gradient magnetic field pulse 22 in FIG. 1(b), and the remaining half of the extension time, into the position ③, immediately before the next negative gradient magnetic field pulse 23.

Here, the phase change $\phi$ of the nuclear spin moving at a predetermined rate is expressed generally by the following formula (1):

$$\phi = \int_{t_0}^{t_1} G\gamma(X_0 + vt)dt \qquad (1)$$

where
 G: intensity of gradient magnetic field,
 $\gamma$: gyromagnetic rotation ratio,
 $X_0$: initial position of nuclear spin,
 v: moving velocity of nuclear spin,
 $t_0, t_1$: irradiation start and stop timing of gradient magnetic field.

As a result, the phase change of the nuclear spin, that forms the original echo signal 28 shown in both of FIGS. 1(c) and 2(c), returns to zero at the peak position of the echo signal 28 (this is referred to as "rephase") as represented by solid line 29 (representing the moving nuclear spin) and dash line 30 (representing the stationary nuclear spin) in (d) of both FIGS. 1 and 2, and the echo signal 28 free from phase distortion can be obtained.

The solid line 29 represents the case where the nuclear spin moves towards a higher magnetic field intensity, and is a secondary function due to the term vt in the formula (1). Since the stationary spin corresponds to the case of v=0 in the formula (1), the phase change is a primary function as represented by the dash line 30.

In the pulse sequence in the gradient magnetic field irradiation method described above, the relation of the gradient magnetic field pulse at the peak position of the echo signal 28 from the excitation of the nuclear spin by the 180° pulse, i.e. the relation of the gradient magnetic field pulse (gradient magnetic field intensity x irradiation time) till the center point of the signal sampling time, is such that [the area of the gradient magnetic field 23] = [the rear of the hatched portion of the gradient magnetic field pulse 24] in FIG. 1(b), while [the area of the gradient magnetic field pulse 25 + the area of the hatched portion of the gradient magnetic field pulse 27] = [the rear of the gradient magnetic field pulse 26] in FIG. 2(b). Therefore, when a free induction decay (hereinafter referred to as "FID") signal 31 excited by the 180° pulse occurs due to incompleteness of the 180° pulse as shown in FIG. 1(e) or 2(e), the phase of the stationary nuclear spin of the FID signal 31 changes in accordance with the principle of the gradient echo method as shown in FIG. 1(f) or 2(f), becomes zero at the center of the sampling time, and becomes an echo signal 32 having its peak at the same position as the peak of the original echo signal 28 excited by the 90° pulse. In this instance, the echo signal 32 due to the FID signal 31 overlaps with the original echo signal 28, and the image resulting from this echo signal 32 turns into the artifact. Accordingly, image quality of the resulting tomogram gets deteriorated.

SUMMARY OF THE INVENTION

It is therefore an object of the present invention to provide a gradient magnetic field irradiation method in an MRI apparatus, and its controlling apparatus, capable of solving the problems with the prior art in that the FID signal resulting from incompleteness of the 180° pulse is rephased and overlaps with the original echo signal during the signal sampling, and results in the artifact on the reconstructed image when the gradient moment nulling method is applied to the spin echo method.

In an MRI apparatus comprising magnetic field generation devices for applying a static magnetic field and a gradient magnetic field to a subject, a transmitter unit for irradiating Rf signals so as to generate nuclear magnetic resonance in the atomic nucleus of atoms constituting the living tissue of the subject, a receiver unit for detecting echo signals emitted by nuclear magnetic resonance, and a signal processing unit for executing an image reconstruction operation by the use of the echo signals detected by the receiver unit, a gradient magnetic field irradiation method in the MRI apparatus according to the present invention for accomplishing the objects described above comprises the steps of irradiating first, second and third gradient magnetic fields in a frequency encoding direction in accordance with a control instruction from a controller inside the signal processing unit described above, providing a pulse sequence for reading out the echo signals by the third gradient magnetic field, and controlling the first, second and third pulses in such a manner as to satisfy the following four conditions:

(1) to establish the relation $$\frac{1}{k} - \frac{4}{n} + 1 = 0$$

when the ratio of intensity of the gradient magnetic fields of the first, second and third pulses is k:n:1. The intensity does not include differences of polarities;

(2) the irradiation time of the first and second pulses is T/k and 2T/n, respectively, when the irradiation time of the third pulse is 2T;

(3) the time interval between the start of the irradiation of the first pulse and the start of the irradiation of the second pulse is equal to the time interval between the start of the irradiation of the second pulse and the start of the irradiation of the third pulse; and (4) a half of a time change quantity of an echo time, when the echo time is changed, is inserted between the first and second pulses and the remaining half is inserted between the second and third pulses.

It is also possible to apply the pulse sequence for irradiating the gradient magnetic fields described above to other sequences employing the spin echo method and to irradiate the first pulse after the 90° pulse but before the 180° pulse and the second and third pulses after the 180° pulse.

Since the present invention has the construction as described above, the present invention can prevent the occurrence of artifacts in the pulse sequence of the spin echo method because an echo signal 32 by the FID signal 31 resulting from incompleteness of the 180° pulse is not rephased during the sampling period of the original echo signal 28 and does not form an image. The effect of rephasing does not drop even when the echo time is changed, and artifacts resulting from motion and flow can be reduced. Accordingly, clinically effective images can be obtained.

BRIEF DESCRIPTION DRAWINGS

Figure 1:
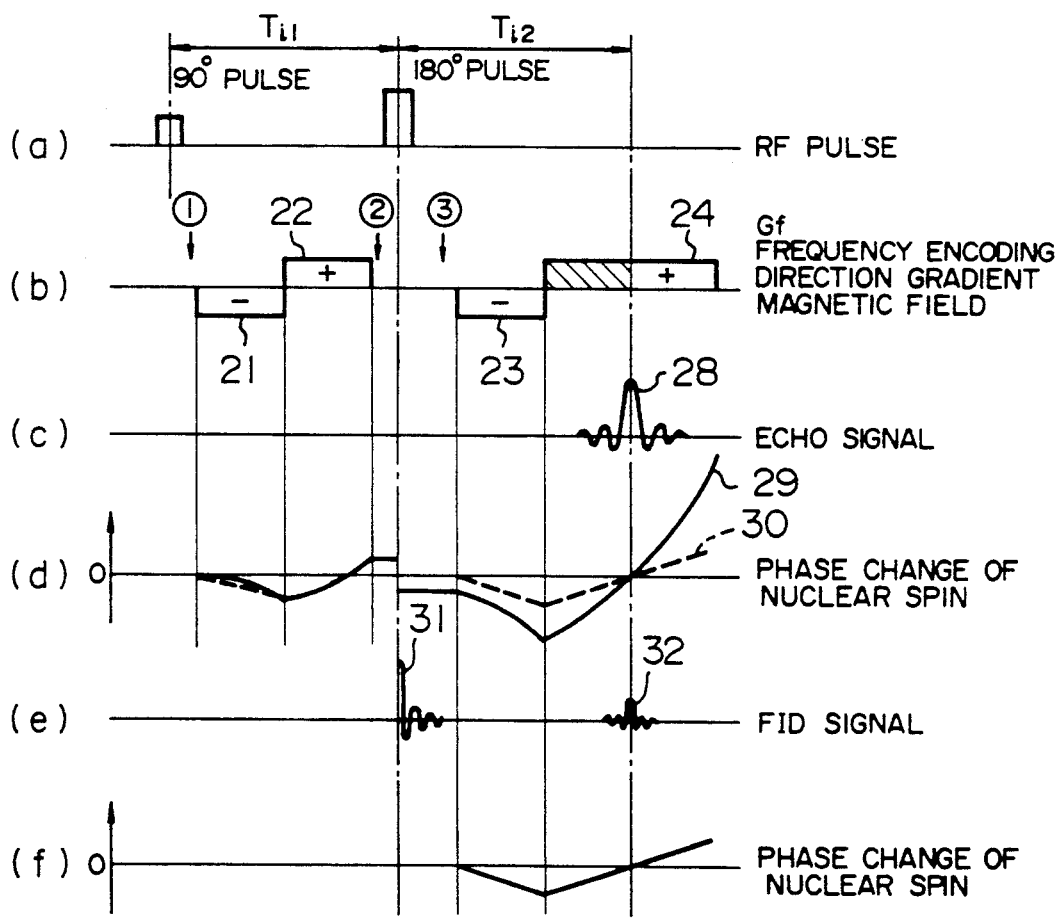
FIG. 1 is a timing diagram showing a pulse sequence in a gradient magnetic field irradiation method according to the prior art and the modes of echo and FID signals when this sequence is executed.
Figure 2:
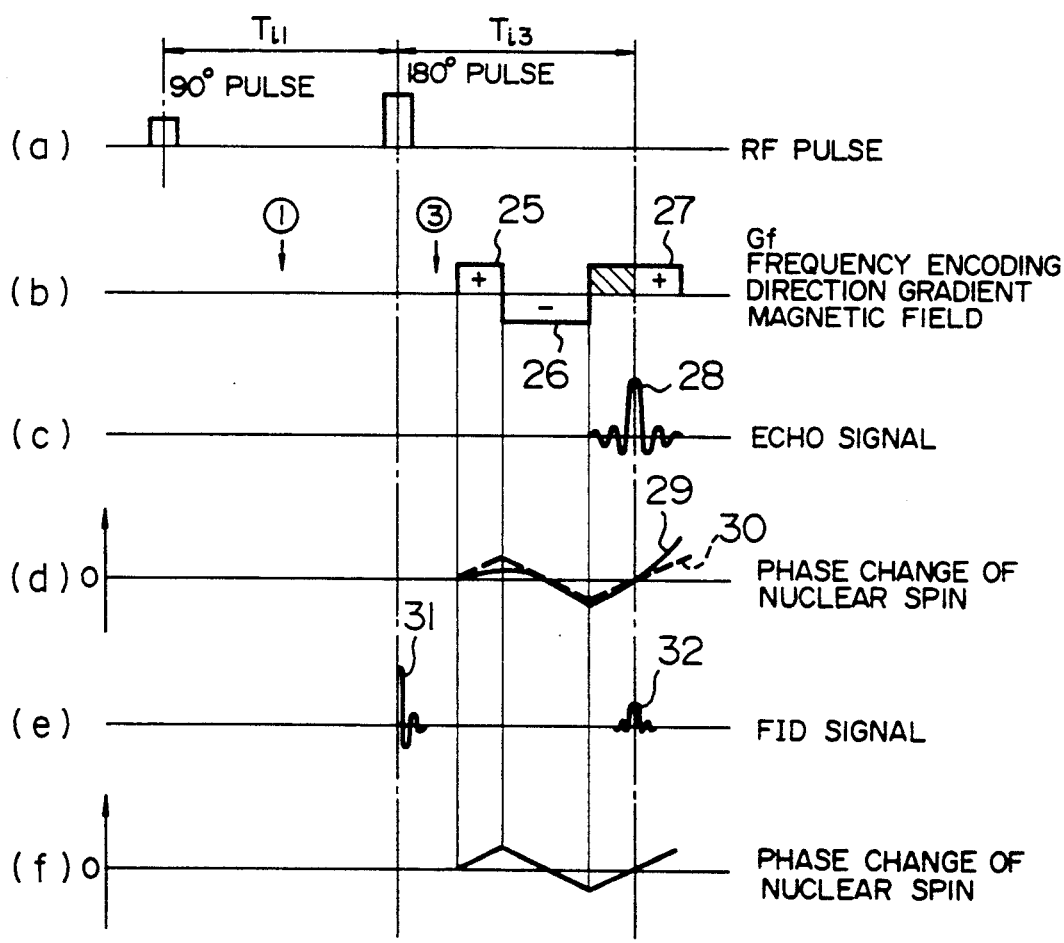
FIG. 2 is a timing diagram showing a pulse sequence in a gradient magnetic field irradiation method according to the prior art and the modes of echo and FID signals when this sequence is executed.
Figure 3:
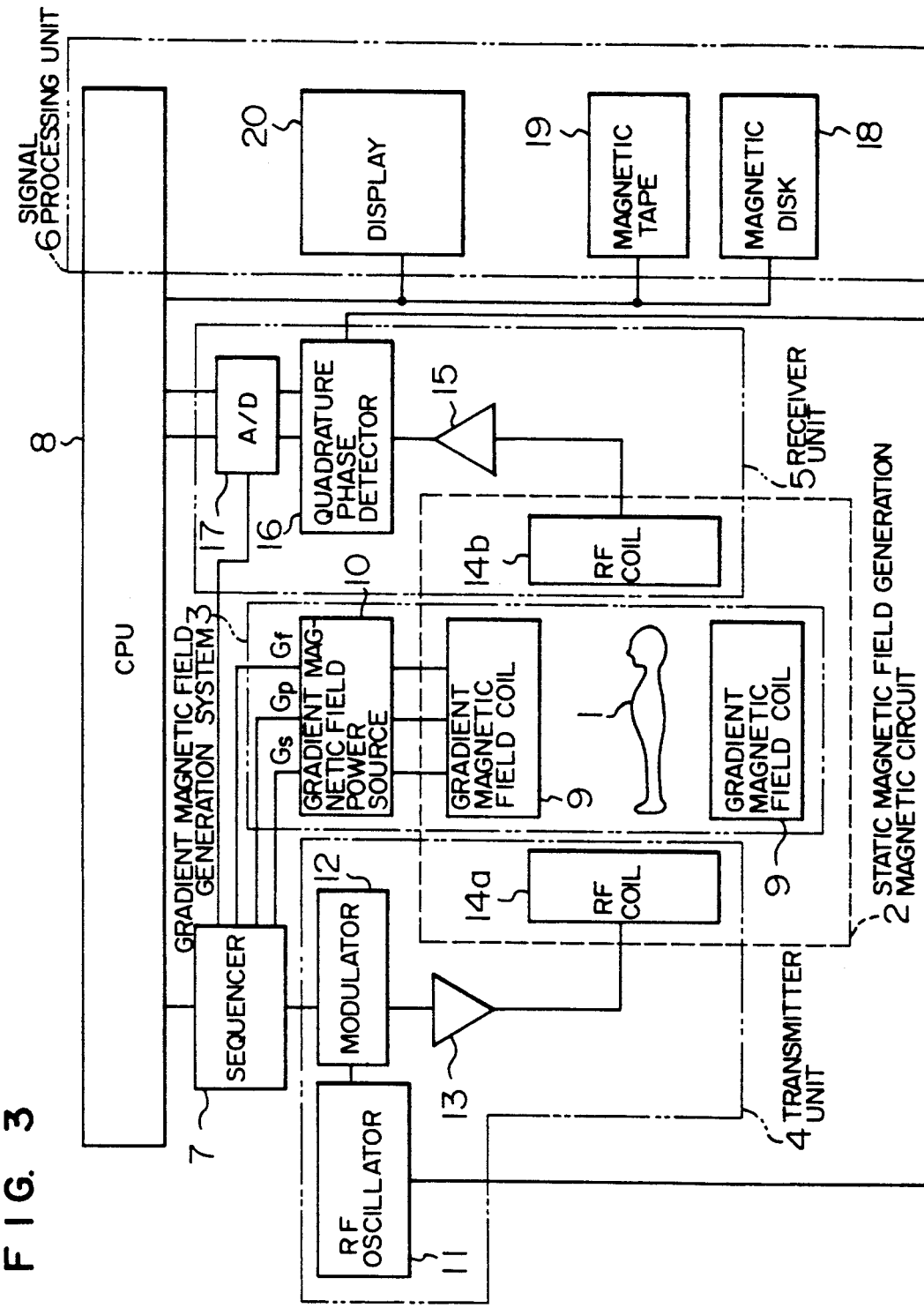
Figure 4:
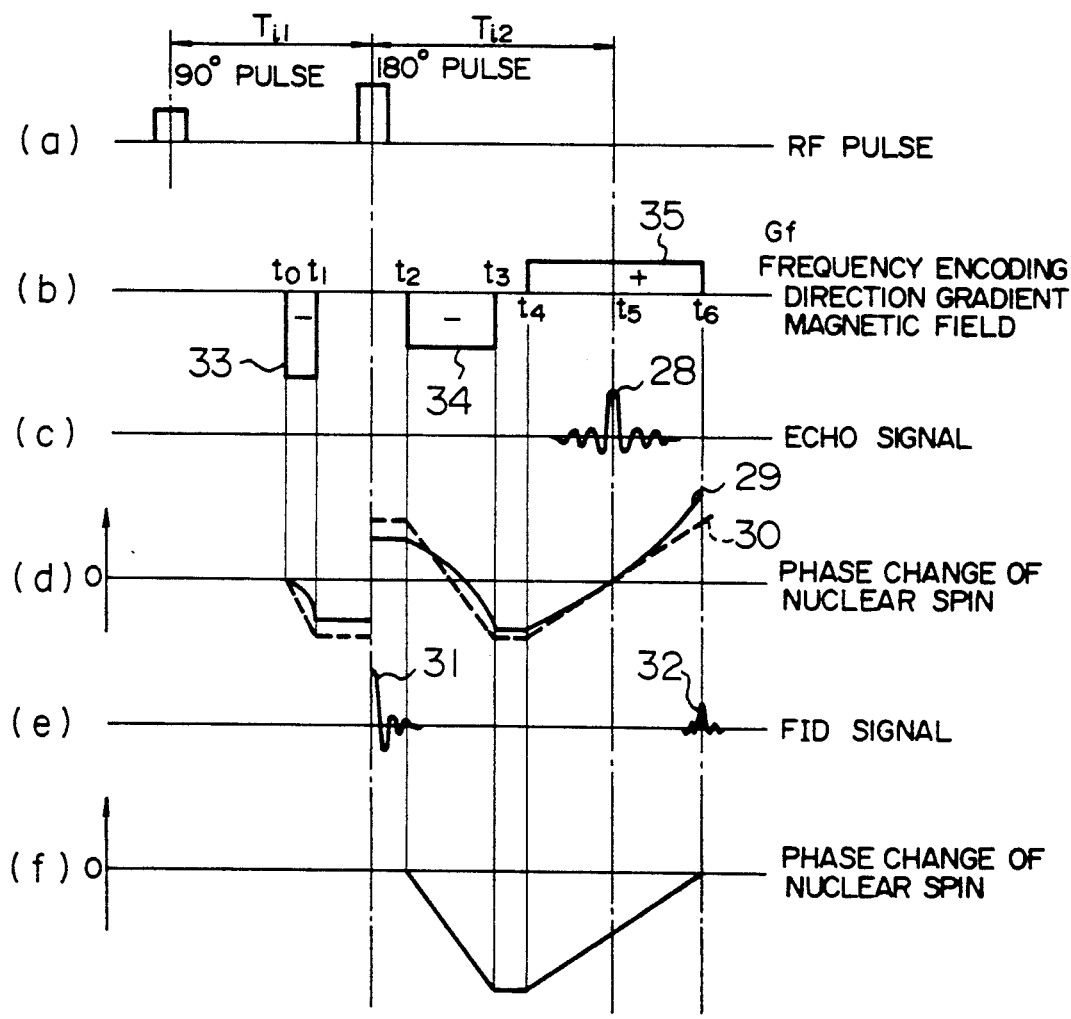
Figure 5:
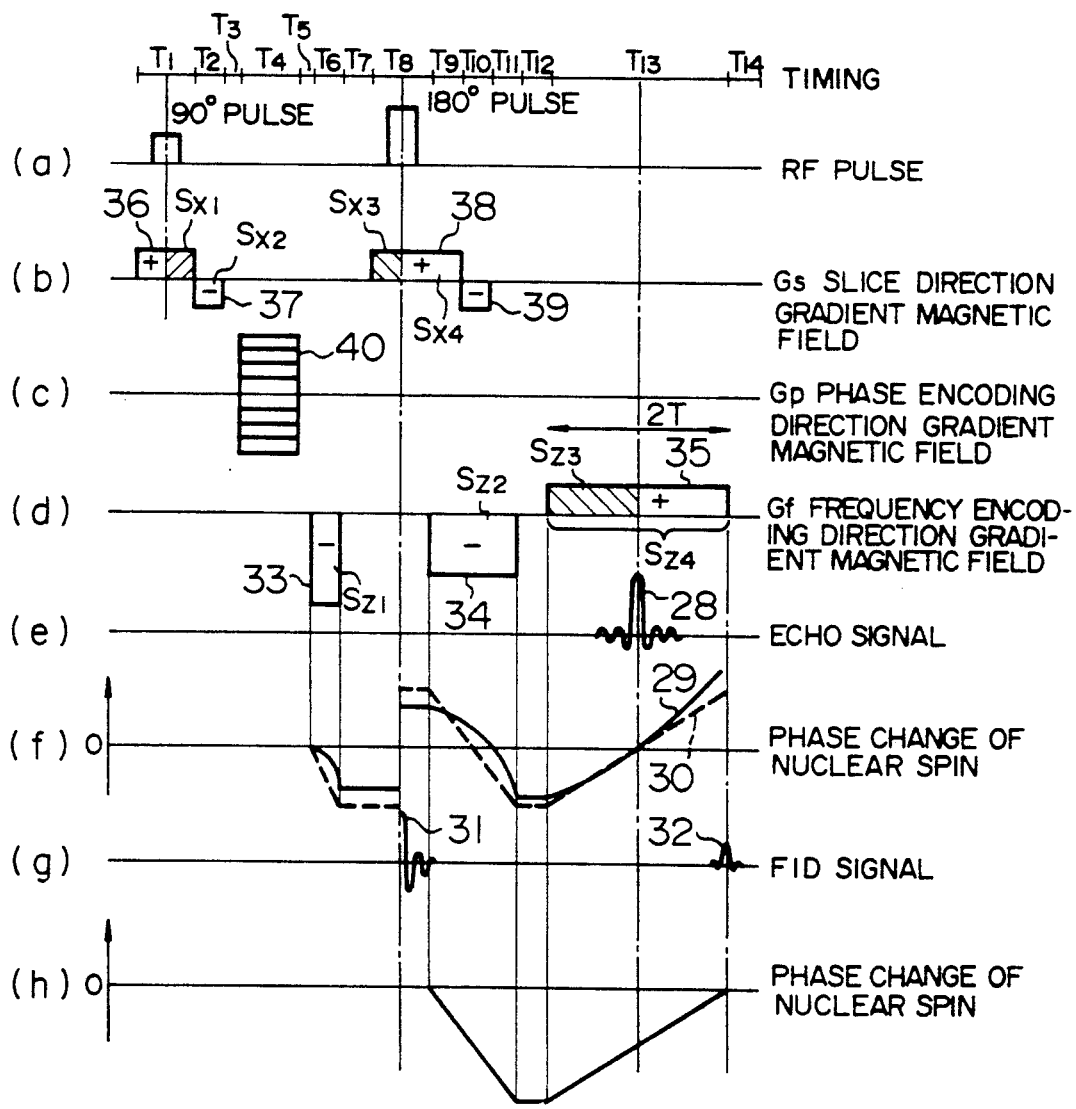

FIG. 3 a block diagram showing the overall construction of an MRI apparatus to which a gradient magnetic field irradiation method is applied according to the present invention;

FIG. 4 is a timing diagram showing a pulse sequence in the gradient magnetic field irradiation method according to the present invention and the modes of echo and FID signals when this pulse sequence is executed; and FIG. 5 is a timing diagram showing a definite example when the gradient magnetic field irradiation method according to the present invention is applied to the pulse sequence of a spin echo method.

DESCRIPTION OF THE PREFERRED EMBODIMENTS

Hereinafter, preferred embodiments of the plane in the subject 1 can be set by selecting the irradiation mode of these gradient magnetic fields.

The transmitter system 4 irradiates a radio frequency (RF) signal so as to cause nuclear magnetic resonance in the atomic nucleus of the atoms constituting the living tissue of the subject 1 by the RF magnetic pulse sent from the sequencer 7, and comprises an RF oscillator 11, a modulator 12, an RF amplifier 13 and an RF coil 14a on the transmission side. The RF pulse outputted from the RF oscillator 11 is amplitude-modulated by the modulator 12 in accordance with the instruction of the sequencer 7. The amplitude-modulated RF pulse is amplified by the RF amplifier 13 and is then supplied to the RF coil 14a disposed in the proximity of the subject 1 so that the electromagnetic waves can be irradiated to the subject 1.

The receiver unit 5 detects echo signals (NMR signals) emitted due to nuclear magnetic resonance of the atomic nucleus of the living tissue of the subject 1, and comprises an RF coil 14b on the reception side, an amplifier 15, a quadrature phase detector 16 and an A/D convertor 17. The electromagnetic wave (NMR signals) from the subject 1 generated in response to the electro-magnetic waves irradiated from the Rf coil 14a on the transmission side is detected by the Rf coil 14b disposed in the proximity of the subject 1, is inputted to the A/D converter 17 through the amplifier 15 and the quadrature phase detector 17, and is converted to a digital present invention will be explained in detail with reference to the accompanying drawings.

FIG. 3 is a block diagram showing the overall construction of an MRI apparatus to which the gradient magnetic field irradiation method according to the present invention is applied. This MRI apparatus obtains a tomogram of a subject by utilizing an NRM phenomenon, and comprises a static magnetic field generation magnetic circuit 2, a gradient magnetic field generation system 3, a transmitter unit 4, a receiver unit 5, a signal processing unit 6, a sequencer 7 and a central processing unit (CPU) 8 as shown in FIG. 3.

The static magnetic field generation magnetic circuit 2 generates a homogeneous magnetic field around the subject 1 in a direction of the body axis or in a direction orthogonal to the body axis, and magnetic field generation means such as a permanent magnet, a resistive magnet or a superconductive magnet is disposed inside a space having a certain expansion around the subject 1. The gradient magnetic field generation system 3 comprises gradient magnetic field coils 9 wound in three-axes directions, i.e. X, Y and Z, and gradient magnetic field power sources 10 for driving these coils. When the gradient magnetic field power sources 10 for the respective coils are driven in accordance with the instruction from the later-appearing sequencer 7, gradient magnetic fields Gs, Gp and Gf in the three X, Y, Z axes directions are irradiated to the subject 1, respectively. A slice quantity. The NMR signals are further converted to two series of collected data sampled by the quadrature phase detector 16, and are sent to the signal processing unit 6.

This signal processing unit 6 comprises a CPU 8, a recording unit such as a magnetic disk 18 and a magnetic tape 19, and a display such as a CRT 20. The CPU 8 executes processings such as Fourier transform, arithmetic operations of correction coefficients, image reconstruction, and so forth, executes appropriate arithmetic operations of a signal intensity distribution on an arbitrary section or a plurality of signals, converts the resulting distribution to images, and displays the images as a tomogram on the display 20.

The sequencer 7 functions as control means for repeatedly irradiating RF magnetic field pulses for generating the nuclear magnetic resonance in the atomic nucleus of the atoms constituting the living tissue of the subject in a certain predetermined pulse sequence, operates under the control of the CPU 8 and sends various instructions necessary for collecting data of the tomogram of the subject 1 to the transmitter unit 4, the gradient magnetic field generation system 3 and the receiver unit 5.

In the MRI apparatus having the construction described above, the gradient magnetic field irradiation method according to the present invention irradiates the gradient magnetic fields in the frequency encoding direction in the pulse sequence shown in FIG. 4. FIG. 4 shows the pulse sequence of the spin echo method. FIG. 4(a) shows the irradiation timing of the 90° and 180° pulses among the RF pulses, (b) shows the irradiation timing of the frequency encoding direction gradient magnetic field Gf, (c) shows the original echo signal measured, (d) shows the phase change of the nuclear spin for forming the echo signal, (e) shows the FID signals generated by the 180° pulse and (f) shows the phase change of the nuclear spin for forming the FID signals.

According to the present invention, first, second and third, three gradient magnetic field pulses 33, 34, 35 are irradiated in the frequency encoding direction as shown in FIG. 4(b), and the third gradient magnetic field pulse 35 is irradiated as a pulse process for reading out the echo signal. The first pulse 33 is positioned between the 90° and 180° pulses shown in (a), and its gradient magnetic field intensity is k times (k: a positive integer) as much as that of the third pulse 35 as the signal readout magnetic field pulse, with its irradiation time being T/k when the irradiation time of the third pulse 35 is 2T.

The reason for the polarity of the first pulse 33 being minus in FIG. 4(b) is that an influence for the phase dispersion of the nuclear spins excited by the first pulse 33 is reverse to those of the second and third pulses.

The second pulse 34 is positioned at the back of the 180° pulse shown in (a), its gradient magnetic field intensity is n times (n: a positive integer) as much as that of the third pulse 35 and its polarity is reverse to the third pulse 35. The irradiation time of the second pulse 34 is 2T/n when the irradiation time of the third pulse 25 is 2T. The interval $T_{i1}$ from the irradiation timing of the 90° pulse to the irradiation timing of the 180° pulse is equal to the interval $T_{i2}$ from the irradiation timing of the 180° pulse to the center of the third pulse 35. When the three gradient magnetic field pulses 33, 34, 35 are applied, the area of the second pulse 34 becomes equal to the full irradiation time of the third pulse 35 as shown in (b). Accordingly, even when the FID signal 31 occurs due to incompleteness of the 180° pulse as described already and shown in (e), the phase of the stationary nuclear spin forming this FID signal 31 becomes zero at the time of completion of the irradiation of the third pulse 35 as shown in (f) because the phases which are dephased by the gradient magnetic field 34 are rephased by the gradient magnetic field 35 in accordance with the formula (1), generating thereby the echo signal 32. Therefore, no image is formed during the signal sampling time by this third pulse 35. Consequently, the echo signal 32 does not overlap as the artifact with the original echo signal 28 shown in (c).

In this case, the phase change of the nuclear spin moving at a moving rate or velocity in the frequency encoding direction can be expressed as follows with $\phi$ representing the phase change quantity, in the pulse sequence constituted as shown in FIG. 4, in accordance with the formula (1) given already:

$$\phi = \int_{t_0}^{t_1} kG\gamma vt \, dt - \int_{t_2}^{t_3} nG\gamma vt \, dt + \int_{t_4}^{t_5} G\gamma vt \, dt$$

$$= G\gamma v \left\{ k \int_{t_0}^{t_1} t \, dt - n \int_{t_2}^{t_3} t \, dt + \int_{t_4}^{t_5} t \, dt \right\}$$

$$= G\gamma v \{ k(t_1^2 - t_0^2) - n(t_3^2 - t_2^2) + (t_5^2 - t_4^2) \}/2$$

When the relation $t_1 - t_0 = T/k$, $t_3 - t_2 = 2T/n$ is used, $$\phi = \frac{G_y v}{2} \left[ k\left\{ \left(t_0 + \frac{T}{k}\right)^2 - t_0^2 \right\} - \right.$$
$$n\left\{ \left(t_2 + \frac{2T}{n}\right)^2 - t_2^2 \right\} +$$
$$\left. (t_4 + T)^2 - t_4^2 \right]$$
$$= \frac{G_y v}{2} \left\{ 2(t_0 - 2t_2 + t_4)T + \right.$$
$$\left. \left(\frac{1}{k} - \frac{4}{n} + 1\right) T^2 \right\}$$

(2)

where $t_0$, $t_2$ and $t_4$ are the irradiation start timing of the three gradient magnetic fields, respectively, $t_1$ and $t_3$ are the irradiation finish timing of the two gradient magnetic fields, and $t_5$ is the time at which $Ti_1$ becomes equal to $Ti_2$ ($Ti_1 = Ti_2$)

When the condition under which the phase change becomes zero is determined in accordance with this formula (2), it can be obtained when the following two formulas are established, by taking the terms in the parentheses in the formula (2) into consideration:

$$t_0 - 2t_2 + t_4 = 0 \quad (3)$$

$$\frac{1}{k} - \frac{4}{n} + 1 = 0 \quad (4)$$

Accordingly, the phase change $\phi$ of the nuclear spin can be kept zero when the conditions of the formulas (3) and (4) are satisfied.

The formula (3) above represents that the value of the formula can be kept zero when the irradiation start timing $t_2$ of the second pulse 34 is positioned at the center between the irradiation start timing $t_0$ of the first pulse 33 and the irradiation start timing $t_4$ of the third pulse 35. Therefore, if the echo time is extended, the extension time is halved equally, and the halves are inserted between $t_1$ and $t_2$, and between $t_3$ and $t_4$. In this way, the time $t_2$ can be kept at the center between the time $t_0$ and $t_4$, and the value of the formula remains always "0". The value of the formula (4) can be kept always at "0" by adjusting the intensity k of the gradient magnetic field and the irradiation time. When such a pulse sequence is employed, the phase change $\phi$ can be kept always at "0" even when the echo time changes, and the drop of the effect of rephasing can be prevented.

Generally, the gradient moment nulling method is set in such a fashion that the polarities of the gradient magnetic field pulses to be irradiated are positive, negative and positive, or positive, negative, negative and positive. In FIG. 4, however, the polarities are shown as negative, negative and positive. This is because the 180° pulse is interposed between the first pulse 33 and the second pulse 34, and the polarity of the phase is inversed by this 180° pulse at the phase change of the nuclear spin as shown in (d).

Next, a definite embodiment of the gradient magnetic field irradiation method according to the present invention will be explained with reference to FIG. 5. This drawing is a timing wiring diagram showing the irradiation timing of the RF magnetic pulse (FIG. 5(a)), the irradiation timing of the gradient magnetic field pulses in three directions ((b) to (d)), the measured echo signal (e) and the FID signal (g) occurring due to incompleteness of the 180° pulse shown in (a) when the gradient magnetic field irradiation method according to the present invention is used for the pulse sequence of the spin echo method.

Hereinafter, the operation of the gradient magnetic field irradiation method of the present invention will be explained with the passage of time on the basis of FIG. 5. First of all, the 90° pulse is irradiated at the timing $T_1$ as shown in (a) and at the same time, the first slice direction gradient magnetic field pulse 36 having the positive polarity is irradiated as shown in (b). Next, the second slice direction gradient magnetic field pulse 37 having the negative polarity is irradiated at the timing T2. The area $Sx_2$ of this pulse 37 is substantially equal to the area $Sx_1$ of the rear portion from the center position of the 90° pulse in the first slice direction gradient magnetic field 36. The next timing $T_3$ is the rest period. Thereafter, the pulse 40 of the phase encoding direction gradient magnetic field is irradiated at the timing $T_4$ as shown in (c). The next timing $T_5$ is the rest period. Thereafter, the pulse 33 of the first frequency encoding direction gradient magnetic field having the negative polarity is irradiated at the timing $T_6$ The area $Sz_1$ of this first pulse 33 is ½ of the area $Sz_2$ of the later appearing second pulse 34, and is set to be substantially equal to the area to the peak position of the echo signal 28 of the later-appearing third pulse 35 (represented by oblique lines) shown in (e). The next timing $T_7$ is the rest period, and the half of the time change is inserted into this period when the echo time is changed.

At the next timing $T_8$, the 180° pulse is irradiated as shown in (a) and at the same time, the pulse 38 of the third slice direction gradient magnetic field having the positive polarity is irradiated as shown in (b). The gradient magnetic field intensity of this pulse 38 is equal to the intensity of the pulse 36 described above. The irradiation of this pulse 38 is continued at the next timing $T_9$ and at the same time, the pulse 34 of the second frequency encoding direction gradient magnetic field is irradiated as shown in (d). As to this pulse 38, the area $Sx_3$ from the start of its irradiation to the center of the 180° pulse shown in (a) is equal to the half of the area $Sx_4$ from the center of the 180° pulse to the end of the irradiation. At the next timing $T_{10}$, the pulse 39 of the fourth slice direction gradient magnetic field having the negative polarity is irradiated as shown in (b) and at the same time, the irradiation of the second pulse 34 in the frequency encoding direction is continued as shown in (d). At the timing $T_{11}$, too, the irradiation of the second pulse 34 is continued as shown in (d). The area $Sz_2$ of this second pulse 34 is equal to the total area $Sz_4$ of the next third pulse 35. The next timing $T_{12}$ is the rest period, and the remaining half of the time change is inserted into this portion when the echo time is changed. Thereafter, the pulse 35 of the third frequency encoding direction gradient magnetic field as the signal readout gradient magnetic field is irradiated as shown in (d). The timing $T_{14}$ is the rest period, and the sequence continues the first timing $T_1$ after a predetermined rest.

In FIG. 5, the first, second and third pulses 33, 34, 35 of the frequency encoding direction gradient magnetic field are the pulses to which the gradient magnetic field irradiation method according to the present sent invention is applied, and these pulses are so set as to satisfy the aforementioned formulas (2) and (3). In other words, when the gradient magnetic field intensity of the first, second and third pulses 33, 34, 35 is $Mz_1$, $Mz_2$ and $Mz_3$, respectively, and the irradiation time the third pulse 35 is 2T, they are so set as to satisfy the following relation while satisfying the condition of the aforementioned formula (4):

$$Mz_1 = -k \times Mz_3, \quad Mz_2 = -n \times Mz_3 \quad\quad 5$$

[(start of irradiation of first pulse 33) to (start of irradiation of second pulse 34)] = [(start of irradiation of second pulse 34) to (start of irradiation of third pulse 35)]

The phase change of the original echo signal 28 in the frequency encoding direction shown in FIG. 5(e), when the frequency encoding direction gradient magnetic field is irradiated as described above, is represented by solid line (representing the moving nuclear spin) in (f) and dash line (representing the stationary nuclear spin). In this case, since the formulas (4) and (5) described above are established, the phase of the moving nuclear spin (solid line 29) returns to zero at the peak position of the echo signal 28 shown in (e), that is, at the center of the signal sampling time, and is rephased. Since the relation $(Sz_1 + Sz_3 = Sz_2)$ is established for the area of the gradient magnetic field as already described, the phase of the stationary nuclear spin (dash line 30), too, is rephased at the peak position of the echo signal 28. On the other hand, FIG. 5(h) shows the phase change of the stationary nuclear spin of the echo signal 32 due to the FID signal 31 (see FIG. 5(g)) resulting from incompleteness of the 180° pulse shown in (a) At this time, since the relation $(Sz_2 = Sz_4)$ is established for the area of the gradient magnetic field pulse, the phase of the nuclear spin becomes zero at the end of signal sampling shown in (d), and image formation is made at this point. The echo signal 32 does not overlap as the artifact with the original signal 28 shown in (e).

In FIG. 5(b), the irradiation pulses of the slice direction gradient magnetic field Gs are shown as four pulses but the present invention is not limited to the four pulses; hence, two or three pulses may be irradiated. In FIG. 5(c), the pulse 40 of the phase encoding direction gradient magnetic field Gp is shown irradiated immediately before the first pulse 33 shown in (d), but the present invention is not particularly limited thereto. In other words, the irradiation timing may be set to any timing so long as the pulse 40 does not overlap with the 90° pulse or 180° pulse shown in (a) or with the third pulse 35 for signal readout shown in (d). Furthermore, although FIG. 5 shows the application of the gradient magnetic field irradiation method according to the present invention to the pulse sequence of the spin echo method, the irradiation condition of the three frequency encoding direction gradient magnetic fields of the present invention is not limited thereto but can likewise be applied to other pulse sequences employing the gradient echo method.

I claim:

1. A gradient magnetic field irradiation method in an MRI apparatus for measuring NMR signals by irradiating a static magnetic field, RF pulses for exciting atomic nuclei, a slice plane selection gradient magnetic field, a phase encoding gradient magnetic field and a frequency encoding gradient magnetic field to a subject, comprising:

(a) a step of irradiating a first RF pulse and said slice plane selection gradient magnetic field and exciting the atomic nuclei in a slice plane;
    (b) a step of irradiating a first frequency encoding gradient magnetic field;
    (c) a step of irradiating a second frequency encoding gradient magnetic field;
    (d) a step of irradiating a third frequency encoding gradient magnetic field; and
    (e) a step of measuring said NMR signals during the irradiation of said third frequency encoding gradient magnetic field; wherein:

said phase encoding gradient magnetic field is irradiated at a timing not overlapping with an irradiation timing of said RF pulses and with an irradiation timing of said third frequency encoding gradient magnetic field; and said first, second and third frequency encoding gradient magnetic fields satisfy the following conditions (A) to (C):

(A) $(1/k) - (4/n) + 1 = 0$ wherein a ratio of intensity of said first, second and third frequency encoding gradient magnetic fields is $k:n:1$;

(B) the irradiation time of said first and second frequency encoding gradient magnetic fields is T/k and 2T/n, respectively, wherein the irradiation time of said third frequency encoding gradient magnetic field is 2T; and (C) a time interval between the start timing of the irradiation of said first frequency encoding gradient magnetic field and the start timing of the irradiation of said second frequency encoding gradient magnetic field is equal to a time interval between the start timing of the irradiation of said second frequency encoding gradient magnetic field and the start timing of the irradiation of said third frequency encoding magnetic field.

2. A gradient magnetic field irradiation method in an MRI apparatus according to claim 1, which further comprises:

a step of inserting a half of a change quantity of an echo time of said NMR signal, when said echo time is changed, between said first and second frequency encoding gradient magnetic field irradiation timings; and a step of inserting the remaining half of said change quantity of said echo time between said second and third frequency encoding gradient magnetic field irradiation timings.

3. A gradient magnetic field irradiation method in an MRI apparatus according to claim 1, further comprising:

a step of irradiating a second RF pulse and said slice plane selection gradient magnetic field between said steps (b) and (c) so as to excite again the atomic nuclei in said slice plane.

4. A gradient magnetic field irradiation method in an MRI apparatus according to claim 1, wherein said first RF pulse is a 90° excitation RF pulse, and said second RF pulse is a 180° excitation RF pulse.

5. An MRI apparatus including static magnetic field generation means; an rf pulse means for exciting atomic nuclei; slice plane selection gradient magnetic field generation means; phase encoding gradient magnetic field generation means; frequency encoding gradient magnetic field generation means; means for controlling the generation of said gradient magnetic fields; means for receiving NMR signals; and means for reconstructing MRI images from said NMR signals and displaying said MRI images; wherein said means for controlling said gradient magnetic field generation means includes:

(1) first control means for generating said first RF pulse and said slice plane selection gradient magnetic field and exciting atomic nuclei in a slice plane;

(2) second control means for generating a first frequency encoding gradient magnetic field after said excitation is effected;

(3) third control means for generating a second frequency encoding gradient magnetic field after said first frequency encoding gradient magnetic field is generated;

(4) fourth control means for generating a third frequency encoding gradient magnetic field after said second frequency encoding gradient magnetic field is generated;

(5) fifth control means for detecting said NMR signals during the irradiation of said third frequency encoding gradient magnetic field; and (6) sixth control means for irradiating said phase encoding gradient magnetic field at a timing not overlapping with the irradiation timings of said RF pulse and said third frequency encoding gradient magnetic field; and wherein said first, second and third frequency encoding gradient magnetic fields satisfy the following conditions (A) to (C);

(A) $(1/k)-(4/n)+1=0$ where a ratio of intensity of said first, second and third frequency encoding gradient magnetic field is $k:n:1$;

(B) the irradiation time of said first and second frequency encoding gradient magnetic fields is $T/k$ and $2T/n$, respectively, wherein the irradiation time of said third frequency gradient magnetic field is $2T$; and (C) a time interval between the start timing of the irradiation of said first frequency encoding gradient magnetic field and the start timing of the irradiation of said second frequency encoding gradient magnetic field is equal to a time interval between the start timing of the irradiation of said second frequency encoding gradient magnetic field and the start timing of the irradiation of said third frequency encoding magnetic field.

6. An MRI apparatus according to claim 5, wherein said control means of said gradient magnetic field generation means further includes:

means for inserting a half of a change quantity of an echo time of said NMR signal, when said echo time is changed, between said first and second frequency encoding gradient magnetic field irradiation timings; and means for inserting the remaining half of said change quantity of said echo time between said second and third frequency encoding gradient magnetic field irradiation timings.

7. An MRI apparatus according to claim 5, wherein said control means of said gradient magnetic field further includes:

means for exciting again the atomic nucleus of said slice plane by irradiating said a RF pulse and said slice plane selection gradient magnetic field during the period between the generation of said first frequency encoding gradient magnetic field and the generation of said second frequency encoding gradient magnetic field.

8. An MRI apparatus according to claim 7, wherein said first RF pulse is a 90° excitation RF pulse and said second RF pulse is a 180° excitation RF pulse.

* * * * *